(12) United States Patent
Lee

(10) Patent No.: US 8,149,635 B2
(45) Date of Patent: Apr. 3, 2012

(54) NON-VOLATILE MEMORY DEVICE AND PROGRAM METHOD THEREOF

(75) Inventor: Seung-Won Lee, Seongnam-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 255 days.

(21) Appl. No.: 12/689,091

(22) Filed: Jan. 18, 2010

(65) Prior Publication Data

US 2010/0232227 A1    Sep. 16, 2010

(30) Foreign Application Priority Data

Mar. 13, 2009  (KR) .................. 10-2009-0021735

(51) Int. Cl.
*G11C 7/00* (2006.01)
(52) U.S. Cl. .................................. 365/189.16; 365/236
(58) Field of Classification Search ............. 365/189.16, 365/189.14, 236
See application file for complete search history.

(56) References Cited

U.S. PATENT DOCUMENTS

| | | | |
|---|---|---|---|
| 5,936,890 A | 8/1999 | Yeom | |
| 6,282,121 B1 | 8/2001 | Cho et al. | |
| 6,356,484 B2 * | 3/2002 | Dosaka et al. | 365/189.18 |
| 6,671,204 B2 | 12/2003 | Im | |
| 7,242,613 B2 * | 7/2007 | Sakui et al. | 365/185.05 |
| 7,391,649 B2 | 6/2008 | Kang et al. | |

FOREIGN PATENT DOCUMENTS

| | | |
|---|---|---|
| JP | 11-110977 | 4/1999 |
| KR | 1020060066958 | 6/2006 |
| KR | 1020060108430 | 10/2006 |
| KR | 1020080029561 | 4/2008 |

* cited by examiner

*Primary Examiner* — Son Dinh
(74) *Attorney, Agent, or Firm* — F. Chau & Asssociates, LLC

(57) ABSTRACT

A non-volatile memory device including a memory cell array; a read/write circuit configured to drive bit lines of the memory cell array with a negative bit line voltage according to data to be programmed; a bit line setup-time measuring circuit configured to measure the bit line setup-time, which may be a function of the amount of data to be programmed, at each ISPP program loop; and a control logic configured to control the program voltage and/or the applied time of a program voltage applied to the selected wordline of the memory cell array based on the measured bit line setup-times measured at each ISPP program loop.

20 Claims, 9 Drawing Sheets

NON-VOLATILE MEMORY DEVICE AND PROGRAM METHOD THEREOF

CROSS-REFERENCE TO RELATED APPLICATIONS

This application claims the benefit, under 35 U.S.C. §119, of Korean Patent Application No. 10-2009-0021735 filed Mar. 13, 2009, the entirety of which is incorporated by reference herein.

BACKGROUND

1. Field of the Inventive Concept

The present invention relates to a non-volatile memory device, and more particularly, to a non-volatile memory device capable of being erased and programmed electrically.

2. Description of the Related Art

Semiconductor memories are a vital microelectronic component of digital logic systems, such as computers and microprocessor-based products ranging from satellites to consumer electronics. Therefore, advances in the design of semiconductor memories including fabrication process enhancements and technology developments providing higher densities and faster speeds help establish performance expectations for other digital components.

Semiconductor memory devices are classified as volatile random access memories (RAMs), or non-volatile memory (NVM) devices. In RAMs, the information (data) is stored either by setting up the logic state of a bistable flip-flop such as in a static random access memory (SRAM), or by the periodic refresh re-charging of a capacitor as in a dynamic random access memory (DRAM). In either case, the data are stored and can be read out only as long as the power is applied, and data are lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing data, even with the power turned off. The non-volatile memory data storage mode may be permanent or reprogrammable, depending upon the technology used. Non-volatile memories are used for program and microcode storage in a wide variety of applications in the computer, avionics, telecommunications, and consumer electronics industries. A combination of single-chip volatile and non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not designed to be erased and written to by the system itself, so that it is not easy for users to update stored contents. On the other hand, EEPROM is capable of being electrically erased and electrically written. The EEPROM is typically applied as an auxiliary memory or in system programming where updates are needed (e.g., flash EEPROM).

SUMMARY OF THE INVENTIVE CONCEPT

One aspect of the inventive concept provides a non-volatile memory device that comprises a memory cell array; a read/write circuit configured to drive each bit line of the memory cell array with a bit line voltage selected according to data to be programmed; a bit line setup-time measuring circuit configured to measure the bit line setup-time (which may vary according to the amount of data to be programmed), at each incremental step-pulse programming (ISPP) program loop; and a control logic configured to control the program voltage applied to the selected wordline of the memory cell array based on the measured bit line setup-time of each ISPP program loop.

Another aspect of the inventive concept provides a programming method of a non-volatile memory device that comprises driving each bit line with a bit line voltage selected according to data to be programmed; measuring the bit line setup-time during which the bit lines are set up to the bit line voltage; and controlling a program condition according to whether a time difference between the measured bit line setup-time and a reference setup-time is less than a reference time.

Still another aspect of the inventive concept provides a programming method of a non-volatile memory device comprising detecting the amount of data to be programmed based on measuring the bit line setup-time during a program execution operation of an ISPP program loop; and controlling the program condition of a next ISPP program loop based on the detection result.

The inventive concept is described more fully hereinafter with reference to the accompanying drawings, in which exemplary embodiments of the inventive concept are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of circuits and circuit blocks may be exaggerated for clarity of illustration. Like numbers refer to like elements throughout.

It will be understood that, although the terms first, second, third etc. may be used herein to describe various elements, components, and/or sections, these elements, components, and/or sections should not be limited by these terms. These terms are only used to distinguish one element, component, or section from another. Thus, a first element, component, or section discussed below could be termed a second element, component, or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items.

BRIEF DESCRIPTION OF THE FIGURES

The above and other features of the present invention will become understood by persons skilled in the art from the following description with reference to the following figures, wherein like reference numerals refer to like parts throughout the various figures unless otherwise specified, and wherein.

DETAILED DESCRIPTION OF EXEMPLARY EMBODIMENTS OF THE INVENTIVE CONCEPT

Figure 1:
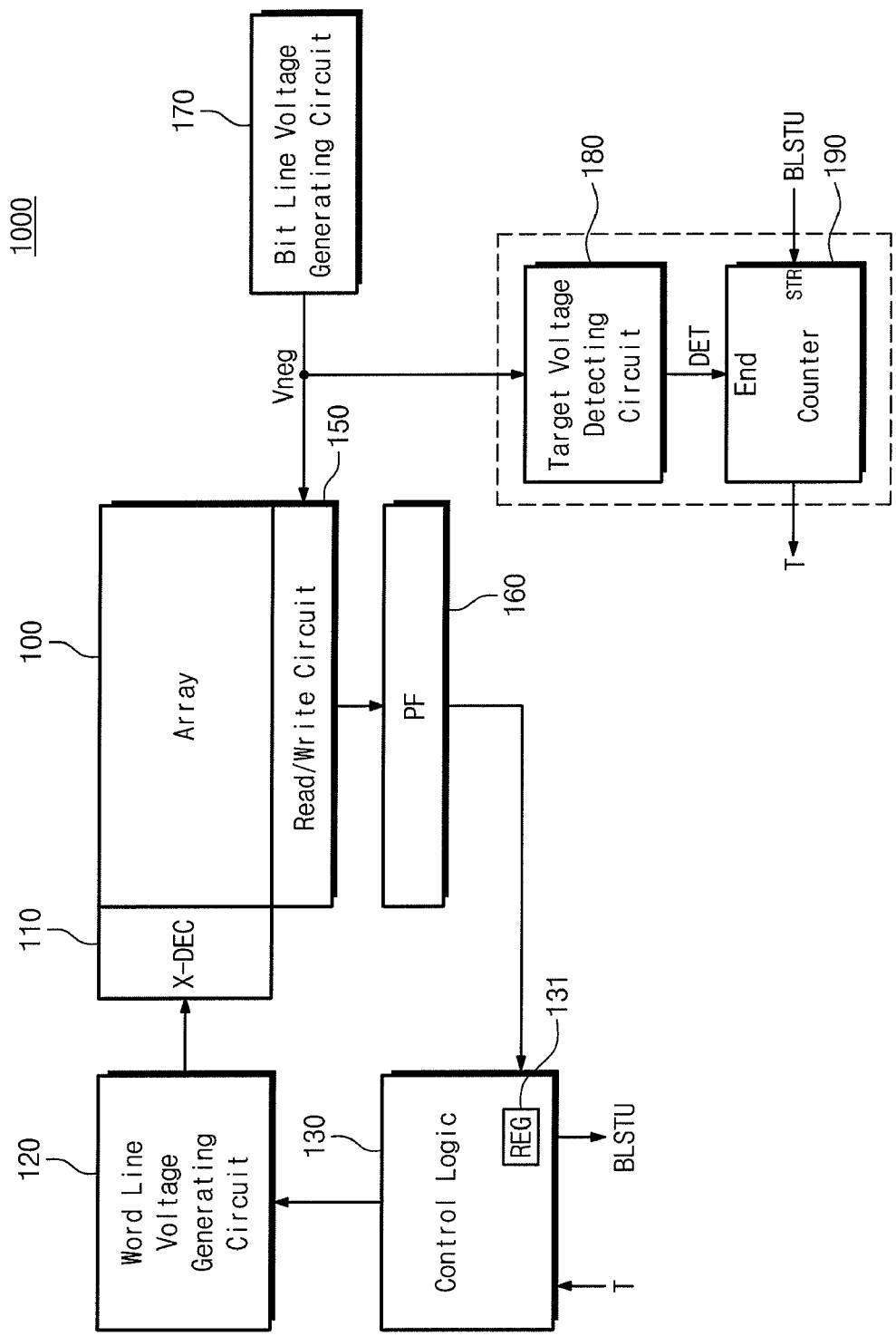
FIG. 1 is a block diagram of a non-volatile memory (NVM) device 1000 according to an exemplary embodiment of the inventive concept.
Figure 2:
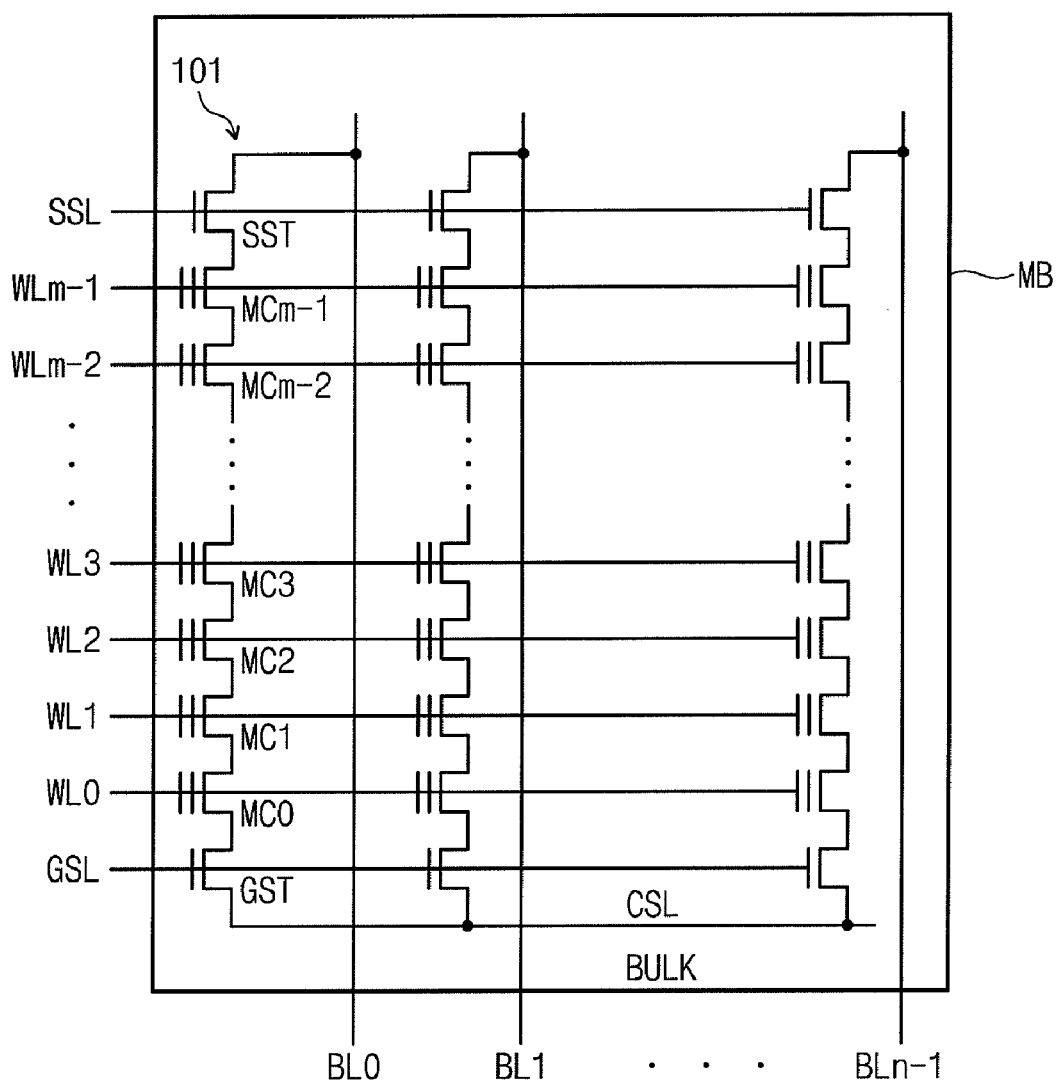
FIG. 2 is a circuit diagram of a memory block in the memory cell array 100 in the NVM device 1000 of FIG. 1.

FIG. 1 is a block diagram showing a non-volatile memory (NVM) device 1000 according to an embodiment of the inventive concept, and FIG. 2 is a circuit diagram the memory cell array 100 in the NVM device 1000 of FIG. 1.

Referring to FIG. 1, a non-volatile memory device 1000 may include a memory cell array 100 that has memory cells arranged in rows and columns that stores data information. Each memory cell may be a non-volatile memory cell having a charge storing layer such as a floating gate or a charge trap layer, or a memory cell having a variable resistance, or another type. Each memory cell may store single-bit data and/or multi-bit data. The memory cells may be arranged to have a single-layer array structure or a multi-layer array structure. FIG. 2, illustrates one memory block MB of the memory cell array 100 including three representative NAND strings. It is well understood that the memory cell array 100 further includes a plurality of memory blocks (not shown) configured the same as shown in FIG. 2.

FIG. The memory block MB shown in FIG. 2 is formed of a plurality of NAND string units (called 'NAND strings' or 'strings') 101 each corresponding to one bit line, (e.g., bit lines BL0~BLn−1). Each NAND string has a string select transistor SST connected to a string selection line SSL, a ground selection line GST connected to a ground selection line GSL, and m memory cells MC0~MCm−1 connected in series between the selection transistors SST and GST each connected to one of m corresponding wordlines WL0~WLm−1. Although not shown in FIG. 2, it is understood that the memory cells in the memory array 100 of FIG. 1 can be arranged to have a NOR connection structure in various other alternative embodiments of the inventive concept.

Returning to FIG. 1, a row (address) decoder circuit 110 is configured to select rows (wordlines, pages) in the memory cell array 110 in response to received address information. The row (address) decoder circuit 110 may be further configured to selected row (wordline) and unselected rows (wordlines) in a selected memory block to be driven with corresponding wordline voltages (for example, a program voltage, an erase voltage, a read voltage, a verification-read voltage, a pass voltage, etc.). A wordline voltage generating circuit 120 may be configured to supply wordline voltages to the row (address) decoder circuit 110 according to the control of the control logic 130. A read/write circuit 150 is configured to read data from the bit lines in the memory cell array 100 during each read operation and to program data in the memory cell array 100 during each program operation. In particular, the read/write circuit 150 drives each of the bit lines of the memory cell array 100 with a bit line voltage (e.g., Vneg or 0V) according to each bit of data to be programmed during a program operation. This will be more fully described below. Exemplary read/write circuits are disclosed in U.S. Pat. Nos. 5,936,890, 6,671,204 and 7,391,649, the entirety of which are incorporated by reference herein.

A pass/fail checking circuit 160 decides program pass/fail based on data read by the read/write circuit 150 and provides its decision result to the control logic 130. Herein, the pass/fail checking circuit 160 may be configured to operate in one of a wired-OR manner and a column scan manner. If configured to operate in the wired-OR manner the read data bits all are checked by the pass/fail checking circuit 160 at the same time. An exemplary wired-OR method is disclosed in U.S. Pat. No. 6,671,204, the entirety of which is incorporated by reference herein. But, it is well understood that the pass/fail checking circuit 160 can be configured to operate in the column scan manner in which read data bits are checked sequentially in each memory page. An exemplary column scan method is disclosed in U.S. Pat. No. 6,282,121, the entirety of which is incorporated by reference herein.

A bit line voltage generating circuit 170 may be configured to generate the bit line voltages (e.g., Vneg 0V) which are used to charge the bit lines. The bit line voltage may be a negative voltage Vneg lower than 0V and is be supplied through the read/write circuit 150 to a bit line or bit lines of the memory cell(s) to be programmed in each memory block. A bit line of a program-inhibited memory cell, for example, may be grounded (0V) by the read/write circuit 150. On the other hand, a bit line of a program-inhibited memory cell, for example, may be driven by a power supply voltage. A target voltage detecting circuit 180 detects whether the bit line voltage Vneg reaches a target voltage (for example, −5V) and generates a detection signal DET as its detection result. A counter 190 may be configured to start counting value T (a bit line setup-time) in response to a control signal BLSTU from the control logic 130 and to stop counting in response to the detection signal DET. The control signal BLSTU may be a signal indicating the start of a bit line setup period. The value T (a bit line setup-time) counted by the counter 190 may be provided to the control logic 130. The counted value T may indicate the time taken for the bit line voltage Vneg to reach its target voltage after a start of a bit line setup period.

The control logic 130 may be configured to control the overall operation of the non-volatile memory device. The control logic 130 generates the control signal BLSTU indicating the start of a bit line setup period of a program operation. The control logic 130 may include a register 131 which stores the count value T provided from the counter 190. The register 131 may be configured to store a current count value and a previous (just previous) count value. A previous count value T may be updated by a current count value T according to iteration of incremental step-pulse programming (ISPP) program loops. The control logic 130 may be configured to calculate the difference (the time difference) between the current count value T and a previous count value T, used as a reference value, and to decide whether the difference between the current count value and the previous count value is below a reference time. The control logic 130 may change the program conditions according to the decision result. For example, the control logic 130 may change the voltage level of a wordline voltage, supplied to a selected wordline, and/or the applied time of the wordline voltage according to the decision result.

In an exemplary embodiment, the target voltage detecting circuit 180 and the counter 190 may constitute a bit line setup time measuring circuit that measures the bit line setup time which may vary according to the amount of data to be programmed at each program loop.

A program (write) operation may be made with a plurality of ISPP program loops, each of which has a bit line setup period, a program execution period, and a verification period. In general, each ISPP program loop may have a predetermined time necessary to execute a program operation with respect to the worst case. For example, the time taken to program all of selected memory cells may be determined by the time needed to execute program loops. As the number of memory cells to be programmed (or, the amount of data to be programmed) increases, the time taken to charge bit lines of memory cells to be programmed with a bit line voltage Vneg may be increased. Such a time may be referred to as a bit line setup time. On the other hand, as the number of memory cells to be programmed (or, the amount of data to be programmed) decreases, the time taken for charging bit lines of memory cells to be programmed with a bit line voltage Vneg may decrease. Thus, the time taken to charge bit lines with a bit line voltage Vneg may be varied according to the amount of data to be programmed. In case of the non-volatile memory device 1000 of FIG. 1, a program condition may be optimized by measuring the bit line setup time of each program loop and changing the program condition according to the measured bit line setup time. Alternatively, the program condition may be optimized by changing a program condition according to the amount of data to be programmed.

Figure 3:
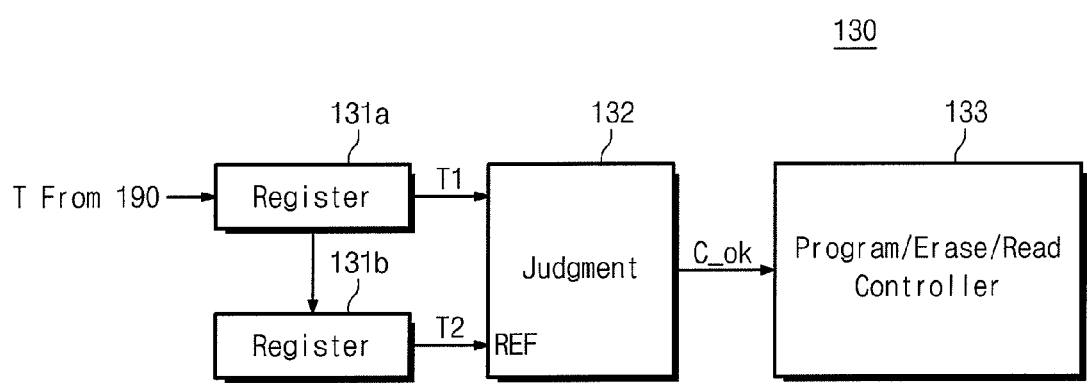
FIG. 3 is a block diagram of a part of the control logic 130 in the NVM device 1000 of FIG. 1.

FIG. 3 is a block diagram of a part of the control logic 130 in the NVM device 1000 of FIG. 1.

Referring to FIG. 3, the control logic 130 includes registers 131 (131a and 131b), a judgment part 132, and a program/erase/read controller 133. The register 131a may be used to store the count value $T_1$ (a bit line setup time) provided from the counter 190 in FIG. 1, and the register 131b may be used to store the count value $T_2$ stored in the register 131a as a reference value (or, a reference setup time). In other words, the register 131a may be used to store the count value $T_1$ measured at a current program loop, and the register 131b may be used to store the count value $T_2$ measured at a previous (or, just previous) program loop. A previous count value $T_2$ stored in the register 131b may be updated by the count value $T_1$ currently stored in the register 131a when the current program loop is ended.

The judgment part 132 may calculate the difference between the count values $T_1$ and $T_2$ stored in the registers 131a and 131b and decide whether the calculated difference is below a reference time. The judgment part 132 may generate a flag signal C_OK as a decision result. If the flag signal C_OK indicates that the calculated difference is more than a reference time, the control logic 130, (the program/erase/read controller 133) may control a program operation so as to be performed under the prior program condition (e.g., that a program condition of a next program loop is not changed). If the flag signal C_OK indicates that the calculated difference is less than the reference time, the control logic 130, (the program/erase/read controller 133) may control a program operation so as to be performed under a different program condition (e.g., that a program condition of a next program loop is changed). As a result, the control logic 130 may change the program condition when the difference between bit line setup times of previous and current program loops is less than the reference time (or, the amount of data to be programmed is below a reference data amount).

In an exemplary embodiment, when the flag signal C_OK indicates that the calculated difference is below the reference time, the program/erase/read controller 133, (the control logic 130) may control the wordline voltage generating circuit 120 such that an increment of a program voltage to be used in a next ISPP program loop is increased. Alternatively, when the flag signal C_OK indicates that the calculated difference is less than the reference time, the program/erase/read controller 133, (the control logic 130) may control the wordline voltage generating circuit 120 (or, circuits 110 and 120) such that the time taken to supply a program voltage to a wordline increases. It is understood the program condition that may be controlled, and the manner in which they may be changed, are not limited to the examples presented in this disclosure.

Figure 4:
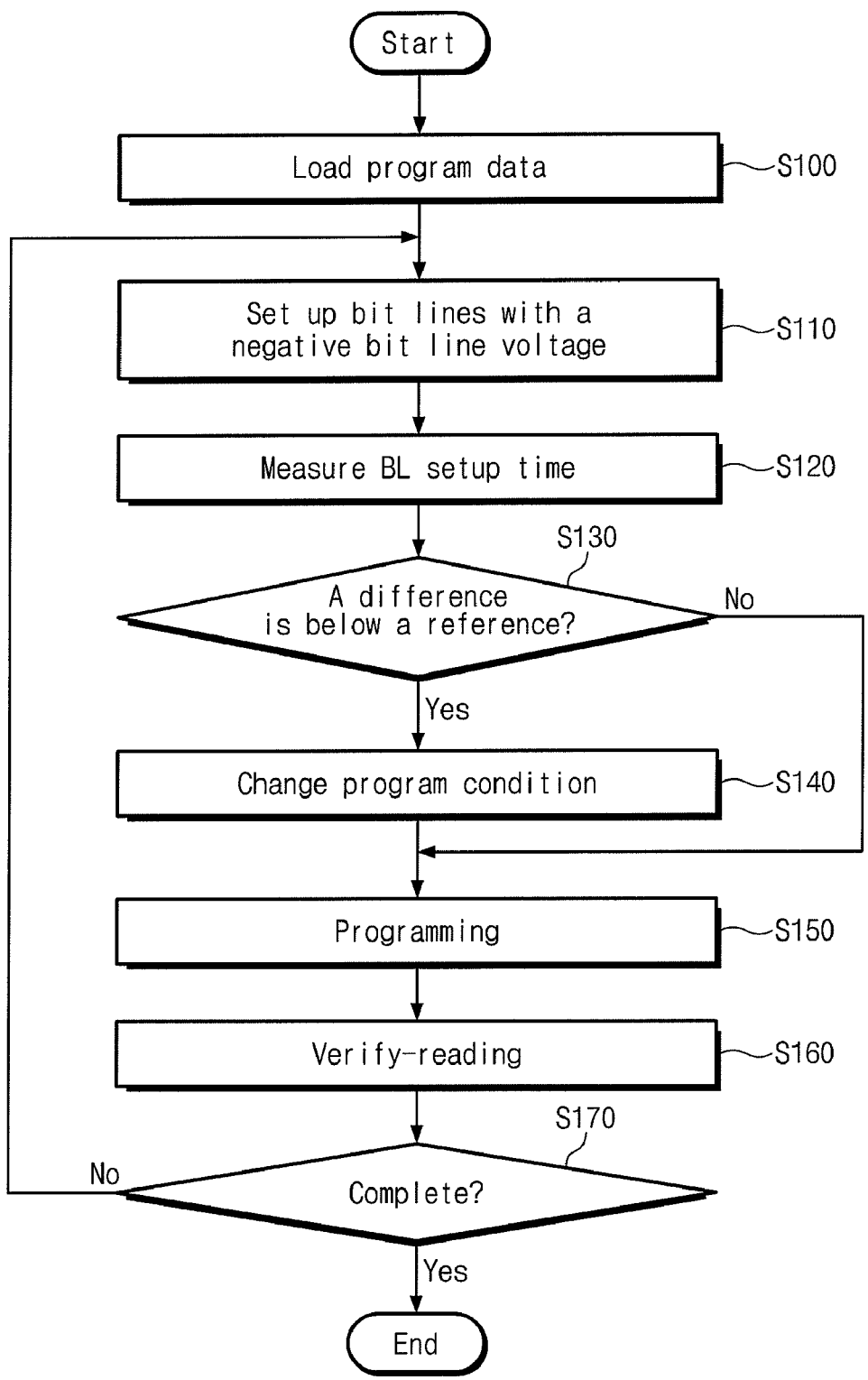
FIG. 4 is a flowchart of a program (e.g., write) operation performed in the non-volatile memory device 1000 of FIG. 11.
Figure 5:
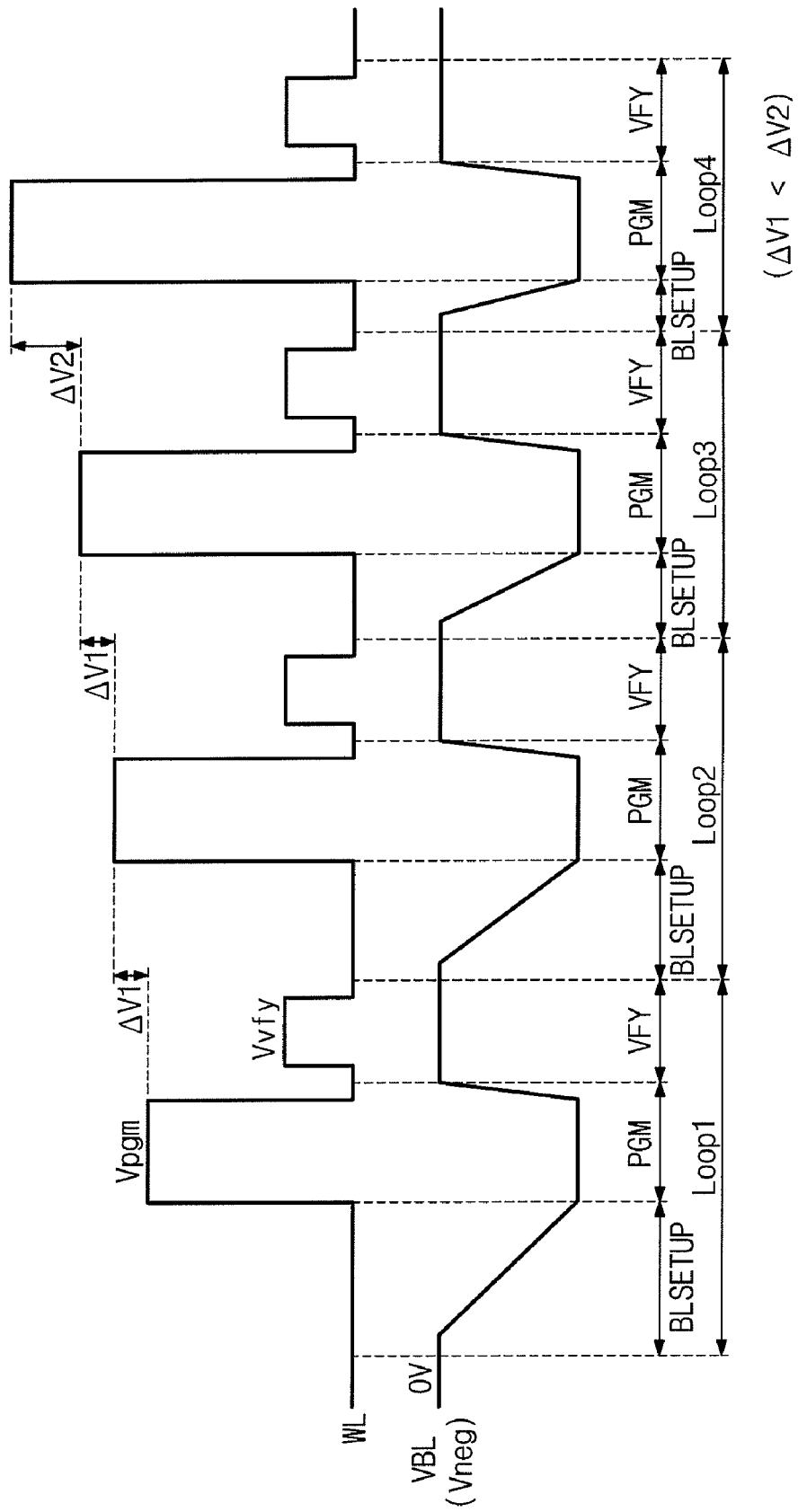
FIG. 5 is a time-voltage graph showing variations of voltages on the bit line voltage and the wordline voltage during an ISPP program (write) operation in the non-volatile memory device 1000 of FIG. 1.
Figure 6:
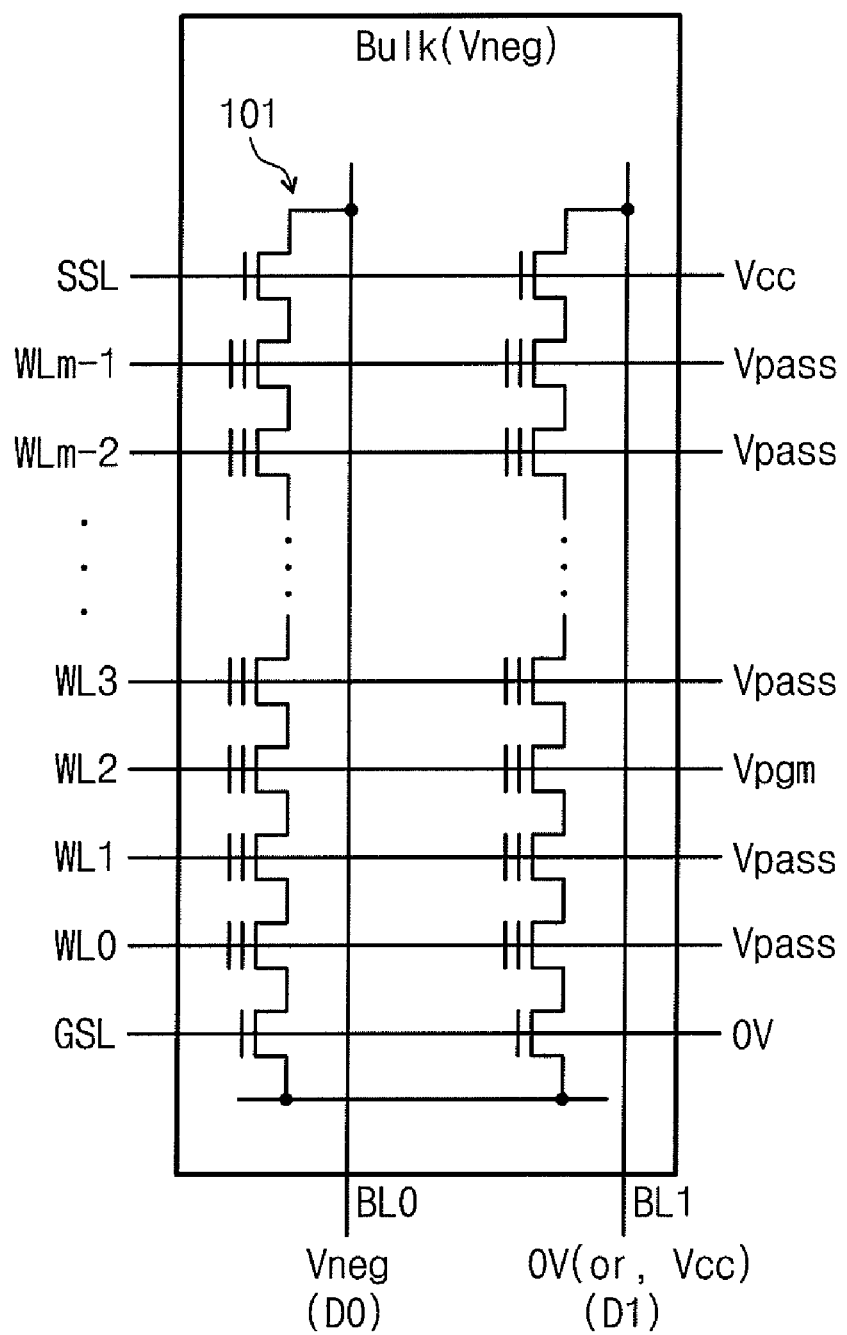
FIG. 6 is a circuit diagram of two NAND strings in the same memory block in the memory cell array 100 of FIG. 1 showing a bias condition during a program (write) operation of the non-volatile memory device 1000 of FIG. 1.

FIG. 4 is a flowchart of a program (e.g. write) operation in the non-volatile memory device 1000 of FIG. 1, FIG. 5 is a time-voltage graph showing variations of voltages on the bit line voltage and the wordline voltage during an incremental step-pulse programming (ISPP) program operation of a non-volatile memory device 1000 of FIG. 1, and FIG. 6 is a circuit diagram of two NAND strings in the same memory block in the memory cell array 100 of FIG. 1 showing a bias condition during a program (write) operation of a non-volatile memory device 1000 of FIG. 1. A program (write) operation of the non-volatile memory device 1000 of FIG. 1 will be more fully described below with reference to the accompanying drawings.

It should be noted that a program operation of a non-volatile memory device may be accomplished by a plurality of ISPP program loops, each loop of which includes a bit line setup period BLSETP, a program execution period PGM, and a verification period VFY. For ease of description, the time taken to execute an ISPP program loop is called the 'program loop time'. As set forth above, a time taken to set up bit lines may be based on the amount of data to be programmed. In case of the non-volatile memory device, the program condition (for example, including an increment of a program voltage, a supply time of the program voltage, etc.) may be changed according to the amount of data to be programmed, so that ISPP program loop times of program loops are changed (or, are different one another).

Referring to FIG. 4, in step S100, data to be programmed may be loaded into buffers in the read/write circuit 150. After loading of the data to be programmed, a program loop may be executed.

In step S110, the read/write circuit 150 drives the n bit lines BL0~BLn−1 with a bit line voltages (e.g., Vneg, 0V) according to the data to be programmed. For example, when data to be programmed is logically '0', as illustrated in FIG. 6, the read/write circuit 150 may drive each selected bit line (for example, BL0) with the bit line voltage Vneg. When data to be programmed is logically '1', as illustrated in FIG. 6, the read/write circuit 150 may drive each unselected bit line (for example, BL1) with 0V (or, a power supply voltage). At the same time, a counter 190 may start to count T in response to the control signal BLSTU as a counter start signal and a target voltage detecting circuit 180 may decide whether the bit line voltage reaches a target voltage. Thus, in step S120, the bit line setup time may be measured by the target voltage detecting circuit 180 and the counter 190. If the detection signal DET indicates that the bit line voltage reaches the target voltage, the counter 190 may stop counting in response to the detection signal DET being a counter end signal. The count value T of the counter 190 may be stored in the register 131*a* of control logic 130 as a bit line setup time.

In decision step S130, the control logic 130 decides whether the difference (time difference) between the measured count value $T_1$ and the reference value $T_2$ is less than a reference time. In an exemplary embodiment, in the event that a current ISPP current program loop is the first program loop, the count value $T_2$ stored in a register 131*b* of the control logic 130, serves as the reference value and may be zero. If the difference between the measured count value $T_1$ and the reference value $T_2$ is more than the reference time, the procedure skips step S140 and advances to programming step S150. If the difference between the measured count value $T_1$ and the reference value $T_2$ is less than the reference time, the procedure advances to step S140 before step S150.

In step S140, the program conditions are changed. In an exemplary embodiment, the change(s) of the program condition may be made by varying the voltage increment of a program voltage Vpgm. As illustrated in FIG. 5, the increment of the program voltage Vpgm may be changed from $\Delta V1$ to $\Delta V2$. The step of $\Delta V1$ is less than the step of $\Delta V2$. For example, if the difference between the measured count value $T_1$ and the reference value $T_2$ is decided to exceed the reference time, the control logic 130 may control the wordline voltage generating circuit 120 such that the increment of the program voltage Vpgm is changed from $\Delta V1$ to $\Delta V2$. This means that the program speed is accelerated. In subsequent programming step S150, selected memory cells (for example, memory cells connected with WL2) may be programmed under the changed program condition thus determined.

As understood from the above description, the program operation in programming step S150 may be executed with the program condition being changed or without changing of the program condition.

During a program operation, as illustrated in FIG. 6, a bit line corresponding to data '0' (D0) is driven by a bit line voltage Vneg being a negative voltage, the program voltage Vpgm (for example, about 10V) is applied to the selected wordline WL2, and a pass voltage Vpass (for example, about 5V) is applied to unselected wordlines WL0, WL1, and WL3~WLm−1. Further, the bulk (substrate) may be biased by a negative voltage such as the bit line voltage. A bit line corresponding to data '1' D1 may be grounded (or, driven by a power supply voltage). The program voltage Vpgm may increase by increment $\Delta V1$ or increment $\Delta V2$ in each iteration of the ISPP program loops.

After the program operation is executed, in verification step S160, a verification-read operation may be performed. During the verification-read operation, the read/write circuit 150 reads data bits from the selected memory cells, and a pass/fail checking circuit 160 decides program pass/fail status of each '1' programmed bit in response to the read data bits. In decision step S170, the control logic 130 decides whether the program operation is completed, based on the output of the pass/fail checking circuit 160. If the program operation is decided to be completed (Yes branch of S170), the program operation may be ended. If the program operation is decided not to be completed (No branch of S170), the procedure returns to step S120.

In FIG. 5, program execution periods and verification periods are maintained the same at each ISPP program loop, while bit line setup periods are different from one another in different ISPP program loops. The amount of data to be programmed decreases according each iterations of program loops. As the amount of data to be programmed decreases, the time taken to set up bit lines is reduced. Small differences among bit line setup times means that program conditions of cells not being programmed are bad. In other words, avoidable program loops may be executed unnecessarily due to cells whose program conditions of cells are bad. This may cause an increase in a total programming time of the memory device. In case of the non-volatile memory device according to an exemplary embodiment of the inventive concept, the programming speed of memory cells may be accelerated by changing the program condition(s). Accordingly, the total programming time may be reduced.

In an exemplary embodiment, it is possible to decide program characteristics (or, the amount of data to be programmed) by detecting bit line setup times of program loops. Further, it is possible to accelerate the programming speed of cells not being programmed according to the decided result. Herein, that a difference is small indicates that the amount of data to be programmed is many, and that a difference is large indicates that the amount of data to be programmed is small. As a result, it is possible to decide the amount of data to be programmed, the number of cells being programmed insufficiently, the program characteristic of cells not being programmed, etc. by checking the bit line setup time of each ISPP program loop. Further, it is possible to provide the decision result to an external device (for example, a controller/memory controller). The external device may manage the non-volatile memory device (or, its memory blocks) using the decision result. For example, it is possible to classify program characteristics of memory blocks variously based on the decision result.

In an exemplary embodiment, program execution of each ISPP program loop may be made after setting up bit lines with the bit line voltage. In other words, program execution of each program loop may be varied in response to determining the difference between bit line setup times.

Figure 7:
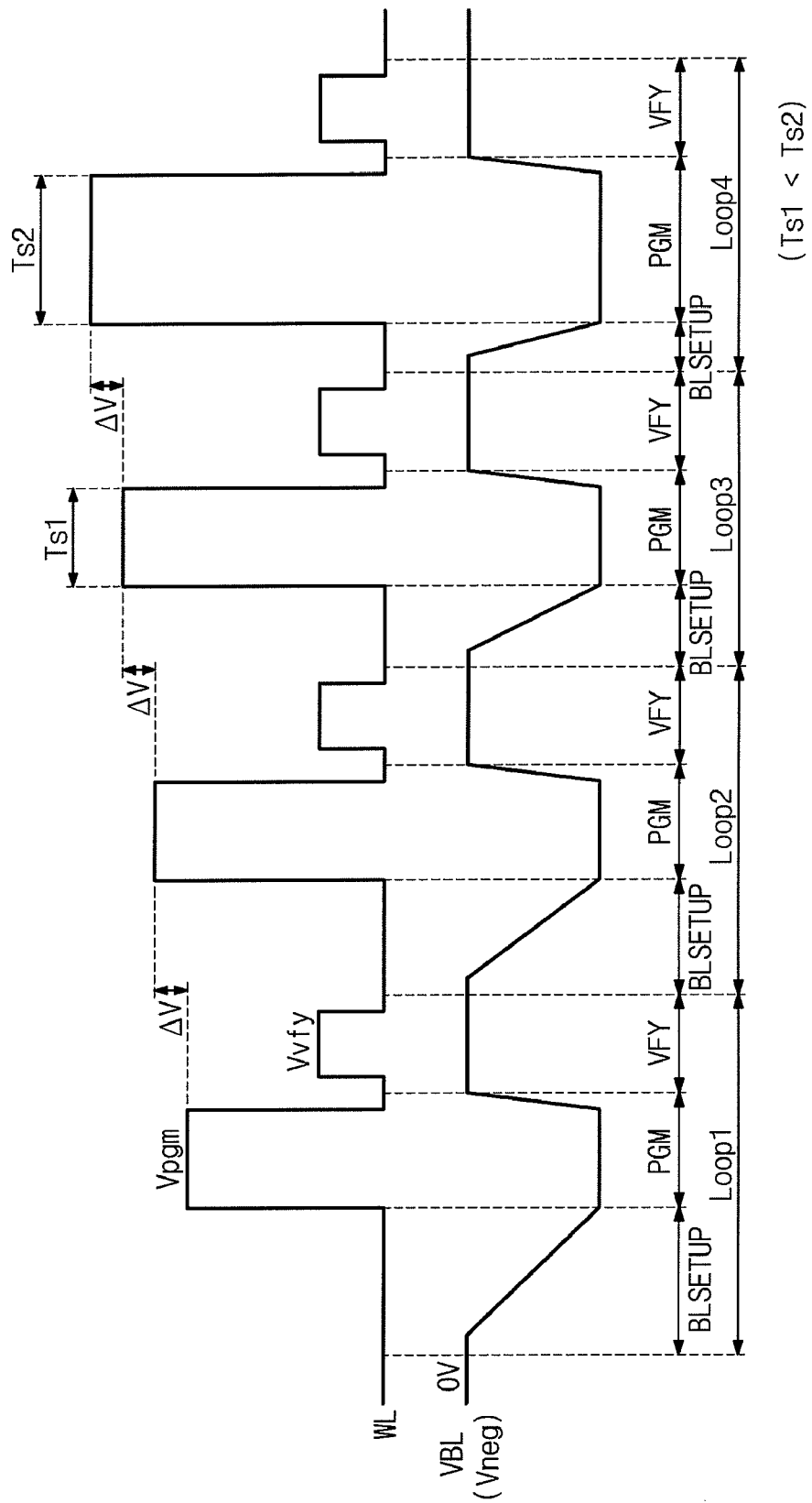
FIG. 7 is a time-voltage diagram showing variations of a the bit line voltage and the wordline voltage during an ISPP program operation of the non-volatile memory device 1000 according to another embodiment of the inventive concept.

FIG. 7 is a time-voltage diagram showing variations of a bit line voltage and a wordline voltage at a program operation of the non-volatile memory device 1000 according to another exemplary embodiment of the inventive concept.

The program method in FIG. 7 is identical to that in FIG. 5 except that the applied time of the ISPP program voltage is changed instead of changing the ISPP step voltage increment of the program voltage. As illustrated in FIG. 7, if the decision to change a program condition is decided in the above-described manner, the supply time of the program voltage may be increased from Ts1 to Ts2. This may be accomplished by controlling the row (address) decoder circuit 110 and the wordline voltage generating circuit 120 of the non-volatile memory device 1000.

In an alternative embodiment, the non-volatile memory device 1000 can be configured to optionally perform the operation of measuring the bit line setup time. For example, it is possible to perform the operation of measuring the bit line setup time of every program loop. Alternatively, it is possible to perform the operation of measuring the bit line setup time after elapse of a given number of program loops.

Figure 8:
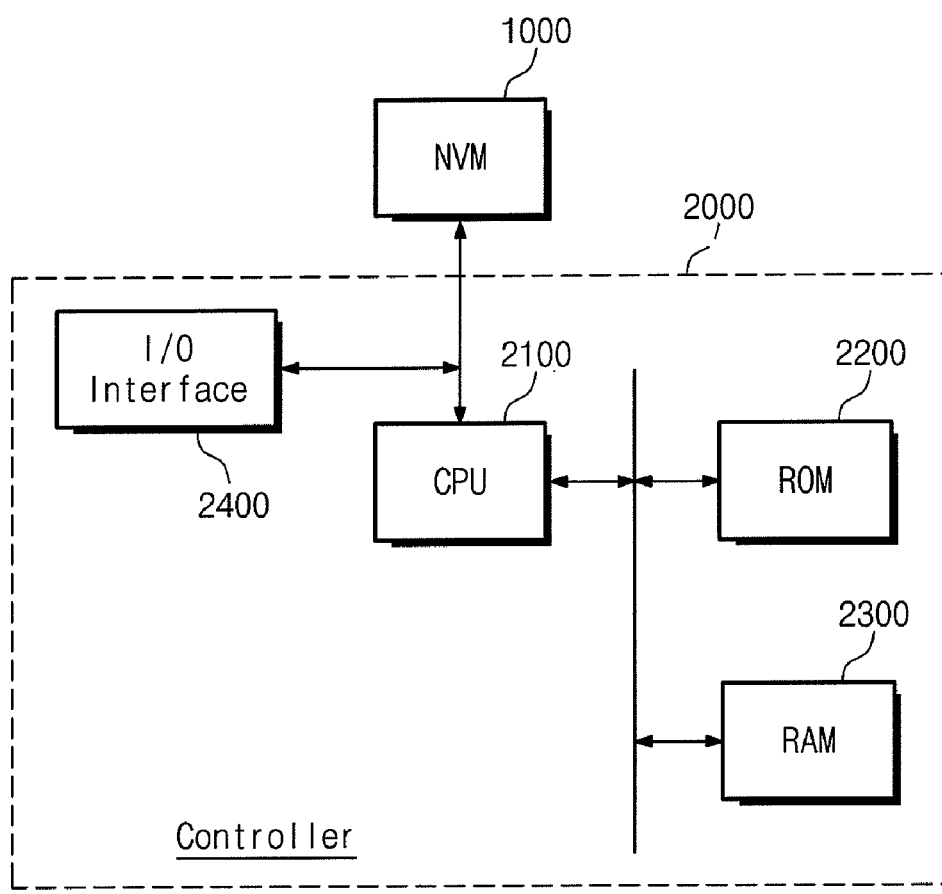
FIG. 8 is a block diagram of a memory card integrated circuit including the non-volatile memory device 1000 of FIG. 1.

FIG. 8 is a block diagram of a memory card integrated circuit (IC) including the non-volatile memory device 1000 of FIG. 1.

Referring to FIG. 8, a memory card IC (for example, a smart card IC) includes the non-volatile memory device 1000 and a memory controller 2000. The non-volatile memory device 1000 may be substantially identical to device 1000 in FIG. 1, and redundant description thereof is thus omitted. The memory controller 2000 may be configured to control the non-volatile memory device 1000 and includes CPU 2100, ROM 2200, RAM 2300, and an input/output interface 2400. The CPU 2100 controls the overall operation of the integrated circuit card based on executable programs stored in the ROM 2200, and the input/output interface 2400 interfaces with an external device (e.g., host computer, not shown). The interface 2400 may be configured to interface with the external device in a wireless (or, non-contact) manner and/or in a wired (or, contact) manner.

In various embodiments, it is possible to configure the non-volatile memory device 1000 such that a decision result based on the bit line setup times is provided to the controller. In this case, the controller may manage the non-volatile memory device 1000 (or, its memory blocks) using the decision result. It is possible to classify program characteristics of memory blocks variously based on the decision result.

Figure 9:
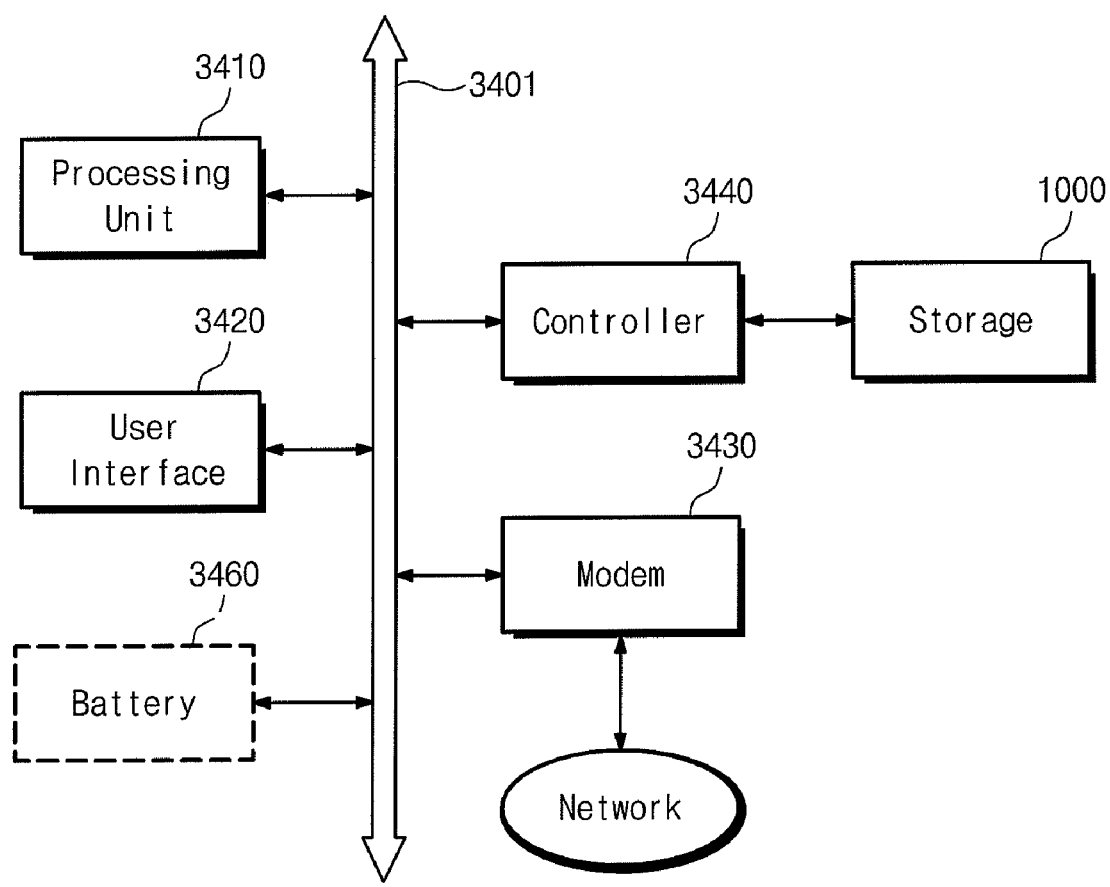
FIG. 9 is a block diagram of a computing system including the non-volatile memory device 1000 of FIG. 1.

FIG. 9 is a block diagram of a computing system including the non-volatile memory device 1000 of FIG. 1.

Referring to FIG. 9, the computing system includes a processing unit 3410 such as a microprocessor or a central processing unit, a use interface 3420, a modem 3430 such as a baseband chipset, a memory controller 3440, and a nonvolatile storage media 1000 connected electrically by a system bus 3401. The nonvolatile storage media 1000 may be configured as the device 1000 shown in FIG. 1. In the storage media 1000, N-bit data (N is a positive integer) to be processed by the processing unit 3410 are stored through the memory controller 3440. If the computing system shown in FIG. 9 is a mobile apparatus (e.g., a cellular phone, a personal digital assistant, a laptop PC), it may be further comprised of a power source, such as battery 3460 for supplying power thereto. Although not shown in FIG. 9, the computing system may be further equipped with an application chipset, a camera image processor (e.g., CMOS image sensor; CIS), a mobile DRAM, etc.

In an exemplary embodiment, the controller 3440 and the storage media 1000 may constitute a memory card, a solid state drive (SSD), or another form of nonvolatile storage.

The storage media 1000 and the memory controller may be packed in various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed examples are to be considered illustrative, and not restrictive, and the appended claims are intended to cover all modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description of exemplary embodiments.

What is claimed is:

1. A non-volatile memory device comprising:
    a memory cell array;
    a read/write circuit configured to drive each bitline of the memory cell array with a bitline voltage selected according to data to be programmed;
    a bitline setup-time measuring circuit configured to measure the bitline setup-time of each incremental step-pulse programming (ISPP) program loop; and
    a control logic configured to control the program voltage applied to the currently selected wordline of the memory cell array based on the measured bitline setup-times of each ISPP program loop.

2. The non-volatile memory device according to claim 1, wherein bitline setup-time changes measurably according to the amount of data to be programmed, and wherein the control logic is configured to control the program voltage based on whether the time difference between a first measured bitline setup-time of a previous ISPP program loop and the second measured bitline setup-time of the current ISPP program loop exceeds a reference time.

3. The non-volatile memory device according to claim 2, wherein if the time difference is less in time than the reference time, then the control logic controls the ISPP increment of the program voltage of the current ISPP program loop to be greater than the ISPP increment of the program voltage of the previous ISPP program loop.

4. The non-volatile memory device according to claim 2, wherein when the time difference is less than the reference time, the control logic controls the applied time of the program voltage of the current ISPP program loop to be greater than the applied time of the program voltage of the previous ISPP program loop.

5. The non-volatile memory device according to claim 1, wherein the bitline setup-time measuring circuit comprises:
    a detection circuit configured to detect whether the voltage of a bitline reaches a negative target voltage; and
    a counter configured to start to begin counting in response to a control signal indicating a bitline setup period and to stop counting in response to the detection result of the detection circuit,
    wherein a count value output by the counter is the measured bitline setup-time of an ISPP program loop.

6. The non-volatile memory device according to claim 1, wherein detecting the difference between the measured bitline setup-time of a previous ISPP program loop and the measured bitline setup-time of a current ISPP program loop is used to select a program condition of memory cells to be programmed.

7. The non-volatile memory device according to claim 1, wherein the amount of data corresponding to cells being programmed insufficiently is detected by calculating the difference between the measured bitline setup-time measured of a previous ISPP program loop and the measured bitline setup-time of the current program loop.

8. A programming method of a non-volatile memory device comprising:
    driving each bitline in an array of non-volatile memory cells to set up bitline voltage selected according to data to be programmed;
    measuring the current bitline setup-time that it took to set up the selected bitline voltage on the bitlines; and
    selecting a program condition based upon the amount of time that the current measured bitline setup-time exceeds a reference setup-time.

9. The programming method according to claim 8, wherein the measured current bitline setup-time is the measured bitline setup-time of a current ISPP program loop, and wherein the reference setup-time is the measured bitline setup-time of a previous ISPP program loop.

10. The programming method according to claim 8, wherein measuring the bitline setup-time comprises:
    starting to count in response to a control signal indicating the start of a bitline setup period;
    detecting when the bitline voltage reaches a target voltage; and stopping counting in response to the detection result, the counted value the measured bitline setup-time.

11. The programming method according to claim 9, wherein the controlling the program condition comprises increasing the ISPP voltage increment of an program voltage of the current ISPP program loop so as to be greater than the ISPP voltage increment of a previous ISPP program loop, if the time difference between the measured bitline setup-time of a current ISPP program loop and the reference setup-time is less than the reference time.

12. The programming method according to claim 9, wherein controlling the program condition comprises controlling the applied time of a program voltage of the current ISPP program loop to be longer than the applied time of the previous ISPP program loop, when the time difference between the measured bitline setup-time of a current ISPP program loop and the reference setup-time is less than the reference time.

13. A programming method of a non-volatile memory device comprising:
  detecting the amount of data to be programmed based on measuring the bitline setup-time within the program execution operation of an incremental step-pulse programming (ISPP) loop; and
  controlling the program condition of the next incremental step-pulse programming (ISPP) program loop based on the detection result.

14. The programming method according to claim 13, wherein the amount of data to be programmed is detected by driving bitlines with a selected bitline voltage according to data to be programmed and measuring a bitline setup-time while the bitlines are charging to the selected bitline voltage.

15. The programming method according to claim 14, wherein a program condition of memory cells being programmed insufficiently is decided based on the detected amount of data to be programmed.

16. The programming method according to claim 13, wherein the program condition is controlled based on the time difference between the measured bitline setup-time and a reference setup-time.

17. The programming method according to claim 16, wherein the reference setup-time is the measured bitline setup-time of a previous ISPP program loop.

18. The programming method according to claim 16, wherein controlling the program condition comprises controlling an the ISPP voltage increment of a program voltage of the current ISPP program loop to be greater than the ISPP voltage increment of a previous ISPP program loop, if the time difference is less than a reference time.

19. The programming method according to claim 16, wherein controlling the program condition comprises controlling the applied time of the program voltage of the current ISPP program loop to be longer than the applied time of the program voltage of the previous ISPP program loop, if the time difference is less than the reference time.

20. The programming method according to claim 16, wherein the detecting the amount of data to be programmed based on measuring a bitline setup-time is carried out every ISPP program loop or after a predetermined number of ISPP program loops.

* * * * *